United States Patent [19]

Isosaka

[11] Patent Number: 4,607,219
[45] Date of Patent: Aug. 19, 1986

[54] METHOD OF INSPECTING SEMICONDUCTOR NON-VOLATILE MEMORY DEVICES

[75] Inventor: Shigekazu Isosaka, Tokyo, Japan

[73] Assignee: NEC Corporation, Tokyo, Japan

[21] Appl. No.: 530,667

[22] Filed: Sep. 9, 1983

[30] Foreign Application Priority Data

Sep. 13, 1982 [JP] Japan .............................. 57-159232

[51] Int. Cl.⁴ ............................................. G01R 31/26
[52] U.S. Cl. ................................. 324/158 R; 29/574; 324/158 T; 371/24
[58] Field of Search ............ 324/158 T, 73 R, 158 R; 371/21, 24, 25; 29/574, 577 C, 583; 365/201

[56] References Cited

U.S. PATENT DOCUMENTS 4,379,259   4/1983   Varadi et al. ................. 324/73 AT Primary Examiner—Stewart J. Levy
Assistant Examiner—Stephen M. Baker
Attorney, Agent, or Firm—Burns, Doane, Swecker & Mathis

[57] ABSTRACT

Memorized data retention characteristics of a FAMOS transistor is tested by writing predetermined information into a semiconductor element while it is in a state of a wafer and the information is read out after the element has been mounted in a package. The written information and the read out information are checked to determine whether they coincide with each other or not.

4 Claims, 2 Drawing Figures

METHOD OF INSPECTING SEMICONDUCTOR NON-VOLATILE MEMORY DEVICES

BACKGROUND OF THE INVENTION

This invention relates to a method of inspecting a semiconductor non-volatile memory device, and more particularly a method of inspecting memorized data retention characteristics of non-volatile memory element including a plurality of field effect transistors having a floating gate.

The construction and operation of a typical non-volatile MOS memory device will first be described. The memory device comprises a non-volatile semiconductor memory element in which a plurality of non-volatile semiconductor transistors such as FAMOS (Floating-gate Avalanche-injection Metal Oxide Semiconductor) transistors are provided as memory cells.

FIG. 1 is a cross-sectional view showing a FAMOS transistor. The transistor is one type of the semi-conductor non-volatile memory cells. The transistor shown in FIG. 1 comprises a semiconductor substrate 1 of one conductive type, a terminal 2 in contact with a substrate electrode 1a provided on the back surface of the semiconductor substrate 1, source and drain regions 3 and 4 of the opposite conductivity type formed separately in one major surface of the substrate by introducing an impurity into the substrate 1, metal conductors 5 and 6 in ohmic contact with the source and drain regions 3 and 4, respectively, source and drain terminals 7 and 8 respectively connected to the metal conductors 5 and 6, a floating gate 9 formed on a gate oxide film 13a and surrounded completely by an oxide film 13b so that the floating gate 9 maintains perfectly an electrically floating state, a control gate 10 provided on the oxide film 13b above the floating gate 9, a metal conductor 11 in ohmic contact with the control gate 10, and a control gate terminal 12 connected to the metal conductor 11.

In the above-described FAMOS transistor, the current flowing between the source and drain regions 3 and 4 is controlled by a voltage applied to the control gate terminal 12 and the potential of the floating gate 9. The potential of the floating gate 9 is determined by the electric charge stored therein. Since the floating gate 9 is completely surrounded by an insulating material such as silicon dioxide, the electric charge in the floating gate 9 remains even when an external power source is interrupted. Ideally, the electric charge stored in the floating gate would be retained eternally. As a consequence, the transistors are provided in the memory element or memory chip of the non-volatile memory device. And the transistor is employed as a non-volatile memory cell by making presence and absence of the electric charge stored in the floating gate correspond to binary values "1" and "0", respectively.

An actually used semiconductor non-volatile memory device is incorporated with about several thousands to several tens of thousands of the memory transistors described above in the memory element and in individual memory transistors shown in FIG. 1, electric charges present in some of the floating gates, but not in the other floating gates. In such a non-volatile semiconductor device, the potential of the floating gate 9 does not vary under an ideal state as described previously, but for some reasons, an electric charge is injected into the floating gate or it flows out, thus varying the potential of the floating gate 9. When such variation is small, highly reliable data retention characteristics can be realized. In order to inspect improper data retention characteristics, that is, potential variation of floating gate, it takes a long time under an actual operating condition. Therefore, for inspecting memory devices having improper data retention characteristics, a special heat aging over a relatively long time is necessary, thus reducing the productivity.

SUMMARY OF THE INVENTION

It is an object of this invention to provide an improved method of inspecting a semiconductor non-volatile memory device capable of solving the problems described above.

According to this invention, there is provided a method of inspecting a semiconductor non-volatile memory device, comprising the steps of writing predetermined information into semiconductor non-volatile memory elements each including a plurality of non-volatile memory cells such as FAMOS transistors in the form of a wafer, dividing the wafer into a plurality of separate non-volatile memory elements, that is, chips, housing each separate semiconductor element in an individual package, reading information out of the complete semiconductor non-volatile memory device and checking with respect to the respective non-volatile memory devices whether the written information coincides with the read out information.

DESCRIPTION OF THE PREFERRED EMBODIMENT

Generally speaking, according to the method of this invention, after forming a plurality of semiconductor non-volatile memory elements in a wafer and conducting electrical testing, predetermined information is written into each semiconductor non-volatile memory element in a state of the wafer and subsequently, a dividing step such as a dicing, and an assembling step comprising housing step are conducted.

The housing step includes mounting the element on the package, wire bonding and sealing. The semiconductor non-volatile memory device is thus completed. Next, if necessary, a thermal aging step, an outer lead frame cut step and a marking step are conducted. In the step of mounting, sealing or thermal aging, thermal stress is applied to the semiconductor non-volatile memory element. Then, in the next inspection step, the information in the memory element of the semiconductor non-volatile memory device is read out. When the read out information coincides with the predetermined information stored in the wafer state, the device is judged to be a good product. On the contrary, when the read out information does not coincide with the predetermined information, the device is judged to be a poor data retention device and rejected as a failure device.

According to this method, no special screening test is necessary to reject a device having improper data retention characteristics.

Figure 1:
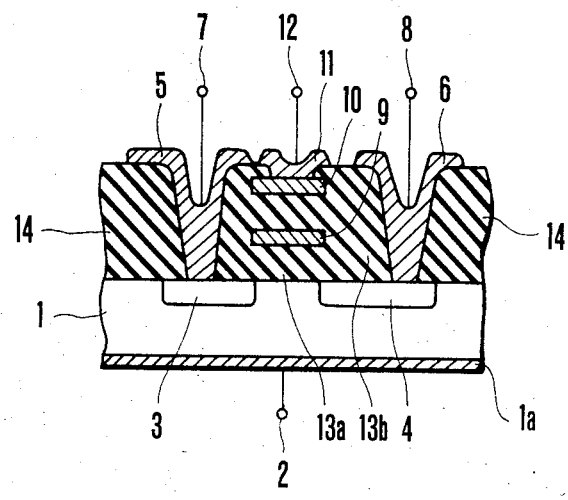
FIG. 1 is a longitudinal cross-sectional view showing a FAMOS transistor.
Figure 2:
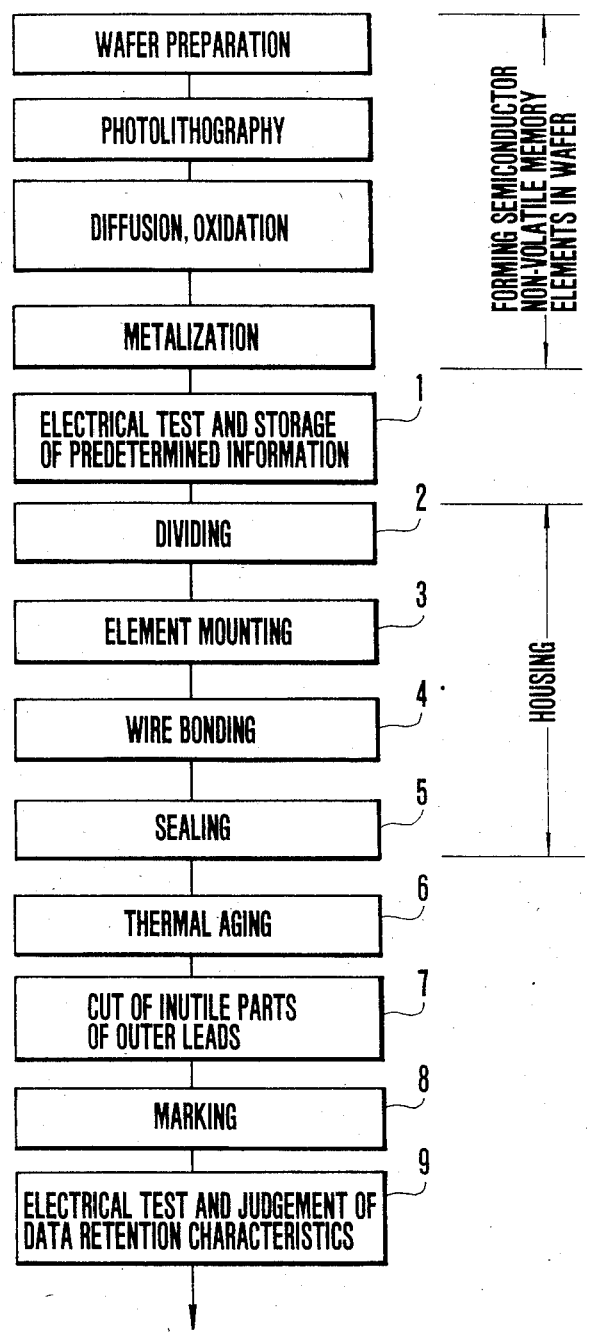
FIG. 2 is a flow chart showing the steps of manufacturing and testing a semiconductor memory device of the embodiment.

A preferred embodiment of this invention will now be described with reference to FIG. 2 showing manufacturing and inspecting steps. More particularly, after ordinary steps of wafer preparation, photolithography, impurity diffusion, oxidation and metallizing, elements in the form of a wafer are formed and subjected to electrical test in step 1 and into the elements which are judged to be good elements in electrical characteristics, a predetermined data is written in the wafer state.

Next, the wafer is divided into a plurality of separate elements in step 2. Then, in the next step 3, each resulting chip is mounted on the package and subjected to thermal stress. Then, in step 4, wires are bonded and subsequently, in step 5, each semiconductor non-volatile memory element is sealed. In step 6, the memory devices are subjected to thermal aging. In the steps 3, 5 and 6, the memory elements are also subjected to thermal stress. The data written into the semiconductor non-volatile memory elements in which the predetermined data have been stored, for example, in the floating gates are subjected to thermal stress in steps 3, 5 and 6. In step 7, inutile parts of outer leads are cut and in step 8, marks are applied. And, in step 9 an electrical test is made, and the stored data is read out. The memory devices in which written and read out data do not coincide with each other are determined as rejects in which the written data are caused to vary by the thermal stress applied in steps 3, 5 and 6.

Results of the reliability test of the semiconductor non-volatile memory device manufactured according to the method of this invention are shown in the following Table.

Sample devices in which the predetermined data stored in the wafer state has been coincident with the read out data in the step 9, show good memorized data retention characteristics, and they are not rejected in the reliability test as shown in Table.

TABLE

| | Results of reliability test | | |
|---|---|---|---|
| test item | test condition | sample number | number of rejects |
| High temp. bias test | Ta = 175° C. Vcc = 6.0V, 1000 Hr | 30 | 0 |
| High temp. storage test | Ta = 200° C. 1000 Hr | 25 | 0 |
| High temp. storage test | Ta = 259° C. 1000 Hr | 22 | 0 |

In the above table, Ta represents test temperature and Vcc represents the applied voltage.

What is claimed is:

1. A method of inspecting semiconductor non-volatile memory devices comprising the steps of: preparing a plurality of semiconductor non-volatile memory elements into the form of a semiconductor wafer, writing predetermined information indicative of data retention capability into said semiconductor non-volatile memory elements in said semiconductor wafer, dividing said semiconductor wafer into a plurality of separate semiconductor non-volatile memory elements, housing said semiconductor non-volatile elements in individual packages to complete said semiconductor non-volatile memory devices, then reading information out of the completed semiconductor non-volatile memory devices respectively, checking with respect to the respective non-volatile memory devices whether said written information indicative of data retention capability coincides with said read out information.

2. The method as defined in claim 1 wherein each of said semiconductor non-volatile memory elements comprises a plurality of floating-gate avalanche-injection field effect transistors, and presence and absence of an electric charge in each floating gate are used as binary "1" and "0" values.

3. A method of manufacturing semiconductor non-volatile memory devices comprising the steps of preparing a semiconductor wafer, forming a plurality of semiconductor non-volatile memory elements in said wafer, subjecting said wafer to a first electrical test to reject unsatisfactory elements, writing predetermined information in non-rejected elements, dividing said wafer into a plurality of separate semiconductor non-volatile memory elements, housing each element in a package so as to complete said memory device, heat aging the complete memory device, and subjecting the completed memory device to a second electrical test, said second electrical test including reading information out of each semiconductor non-volatile memory element and comparing the read-out information with said predetermined information.

4. A method of inspecting a FAMOS (floating-gate avalanche-injection metal oxide) semiconductor having a floating gate, comprising the steps of:
writing information into said FAMOS by supplying an electrical charge to the floating gate;
housing said FAMOS;
heat aging the FAMOS;
reading information of the heat aged FAMOS; and
checking the read information to determine if it coincides with the written information.

* * * * *